United States Patent
Gupta et al.

(10) Patent No.: US 10,020,036 B2
(45) Date of Patent: Jul. 10, 2018

(54) ADDRESS BIT REMAPPING SCHEME TO REDUCE ACCESS GRANULARITY OF DRAM ACCESSES

(71) Applicant: NVIDIA CORPORATION, Santa Clara, CA (US)

(72) Inventors: Alok Gupta, Fremont, CA (US); Wishwesh Gandhi, Sunnyvale, CA (US); Ram Gummadi, San Jose, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 90 days.

(21) Appl. No.: 13/712,823

(22) Filed: Dec. 12, 2012

(65) Prior Publication Data
US 2014/0160876 A1    Jun. 12, 2014

(51) Int. Cl.
| | |
|---|---|
| *G11C 8/00* | (2006.01) |
| *G11C 8/06* | (2006.01) |
| *G06F 12/02* | (2006.01) |
| *G11C 7/10* | (2006.01) |

(52) U.S. Cl.
CPC ............ *G11C 8/00* (2013.01); *G06F 12/0207* (2013.01); *G11C 8/06* (2013.01); *G11C 7/1075* (2013.01); *G11C 2207/105* (2013.01)

(58) Field of Classification Search
CPC . H01L 27/10802; H01L 27/108; H01L 21/00; H01L 27/10894; H01L 27/105
USPC .......... 365/238.5, 220, 230.03, 238, 230.01, 365/189.011, 49.1; 711/101.105, 167, 711/105
See application file for complete search history.

(56) References Cited

U.S. PATENT DOCUMENTS

| | | | | |
|---|---|---|---|---|
| 5,590,071 A | * | 12/1996 | Kolor et al. ................. | 365/149 |
| 5,890,195 A | * | 3/1999 | Rao .................... | G06F 12/0215 |
| | | | | 711/104 |
| 6,438,015 B2 | * | 8/2002 | Kyung .................... | G11C 5/06 |
| | | | | 365/189.03 |
| 8,072,463 B1 | | 12/2011 | Van Dyke et al. | |
| 2005/0235066 A1 | * | 10/2005 | Floman ................ | G11C 7/1066 |
| | | | | 710/3 |
| 2008/0126691 A1 | * | 5/2008 | Yang et al. .................. | 711/105 |
| 2009/0157993 A1 | * | 6/2009 | Garrett, Jr. ........... | G11C 7/1042 |
| | | | | 711/167 |
| 2011/0153925 A1 | * | 6/2011 | Bains .................. | G06F 13/1678 |
| | | | | 711/105 |

(Continued)

OTHER PUBLICATIONS

Jedec Solid State Technology Association, "DDR2 SDRAM Specification", Jan. 2004, pp. 1-82.

*Primary Examiner* — Alexander Sofocleous
*Assistant Examiner* — Alfredo Bermudez Lozada
(74) *Attorney, Agent, or Firm* — Artegis Law Group, LLP

(57) ABSTRACT

One embodiment of the present invention sets forth a method for accessing non-contiguous locations within a DRAM memory page by sending a first column address command to a first DRAM device using a first subset of pins and sending a second column address command to a second DRAM device using a second subset of repurposed pins. The technique requires minimal additional pins, space, and power consumption. Further, sending multiple column address commands allows for increased granularity of DRAM accesses and therefore more efficient use of pins. The technique for accessing non-contiguous locations within a DRAM memory page.

18 Claims, 6 Drawing Sheets

(56) References Cited

U.S. PATENT DOCUMENTS

2013/0339592 A1* 12/2013 Yu et al. .................... 711/105
2014/0160876 A1* 6/2014 Gupta et al. ............... 365/238.5

* cited by examiner

CONCEPTUAL DIAGRAM

ADDRESS BIT REMAPPING SCHEME TO REDUCE ACCESS GRANULARITY OF DRAM ACCESSES

BACKGROUND OF THE INVENTION

Field of the Invention

The present invention relates generally to computer systems and, more specifically, to an address bit remapping scheme to reduce access granularity of DRAM accesses.

Description of the Related Art

Current memory interfaces typically implement a data bus and a command bus for communicating with a memory device. The command bus is used to send row and column commands and addresses to the memory device, while the data bus is used to transfer read and write data to or from the memory device. For example, the JEDEC specification for DDR3 SDRAM defines sixteen address pins (A0-A15), three bank address pins (BA0-BA2), and five command pins (CS#, CKE#, RAS#, CAS#, WE#), for a total of twenty-four pins. The JEDEC specification for GDDR5 SGRAM defines fourteen address pins (A0-A12, plus RFU (Reserved)) and four bank address pins (BA0-BA3), an address bus inversion pin (ABI#), and five command pins (CS#, CKE#, RAS#, CAS#, WE#), for a total of fifteen pins.

Each command operation results in a fixed number of data transfers from the memory device. This fixed number is referred to as the minimum burst length. The burst length of a memory transaction between a memory controller and a memory device, such as a dynamic random access memory (DRAM) device, is determined by the ratio between the frequency of the memory interface between a conventional memory controller and the DRAM device and the frequency at which the DRAM device core operates. As DRAM devices have evolved over time, the second frequency has remained relatively constant, but the first frequency has generally increased with each new generation of DRAM device. For example, a double data rate (DDR) DRAM device that performs two data transfers per clock cycle, e.g., a DDR2 device, uses a minimum burst length of 4, and DDR3/sDDR3/LPDDR3/GDDR5 devices use a minimum burst length of 8. Assuming the trend continues, the next generation of DRAM devices could have a minimum burst length of 16 or higher.

As the minimum burst length increases, and with wider memory interface widths, the minimum amount of data that is transmitted over the memory interface between the DRAM device and the memory controller during a burst, referred to as "the minimum prefetch," increases. For example, on an x64 memory interface, the minimum prefetch was 32-bytes for DDR2 devices, but the minimum prefetch increased to 64-bytes for DDR3 devices. Increased minimum prefetch causes inefficiencies for conventional memory controllers designed to access a DRAM device in 32 byte increments. Additionally, the 32 byte increments may not be stored in adjacent memory locations within the DRAM. When the amount of data that is transmitted over the memory interface between the DRAM and the processor during a burst increases from 32 bytes to 64 bytes half of the data may not be needed and is discarded by the memory controller.

One possible approach to dealing with the above problem would be to redesign conventional processors to access data in 64 byte or larger increments. As a general matter, re-designing a processor is generally undesirable for time and cost reasons. Also, on a single interface, it may be desirable for the memory controller to access different non-contiguous locations on the DRAM page. A 64-byte prefetch forces a memory controller to always access consecutive locations in a page.

Another possible approach is to add an additional interface to allow for independent access to each interface. This approach splits the 64-bit data interface into two separate data ports to provide two 32-bit data interfaces that each support accesses having a minimum burst size that is half of the minimum burst length for a single 64-bit interface. The number of pins needed to transmit and receive the data is unchanged for two 32-bit data interfaces compared with a single 64-bit data interface. However, independent command and address information is needed for each data port so that the 32 byte increments of data are not constrained to be stored in adjacent memory locations or be otherwise related in a manner that allows the same address to be used to access the two separate data ports. For these reasons, a dedicated command and address interface would usually be provided for each data interface. However, each additional dedicated command and address interface requires additional pins. Increasing the number of pins is usually undesirable because the cost of the device in area and power may also increase.

As the foregoing illustrates, what is needed in the art is an improved approach for accessing non-contiguous locations within the same memory page.

SUMMARY OF THE INVENTION

One embodiment of the present invention sets forth a method for accessing non-contiguous locations within a DRAM memory page. The method generally includes transmitting a row address command to a first DRAM device and to a second DRAM device via a plurality of pins on a memory controller and a corresponding plurality of pins on the first DRAM device and the second DRAM device, transmitting a first column address command to the first DRAM device and a second column address command to the second DRAM device via the plurality of pins on the memory controller, and transmitting a data command to the first DRAM device and the second DRAM device via a plurality of pins on the memory controller and a corresponding plurality of pins on the first DRAM device and a corresponding plurality of pins on the second DRAM device.

One advantage of the disclosed technique is that it requires no additional pins, space, or power consumption. Further, sending multiple address commands allows for increased granularity of DRAM accesses and therefore more efficient use of pins. Thus, the disclosed technique provides a better approach for accessing non-contiguous locations within a DRAM memory page.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

System Overview

Figure 1:
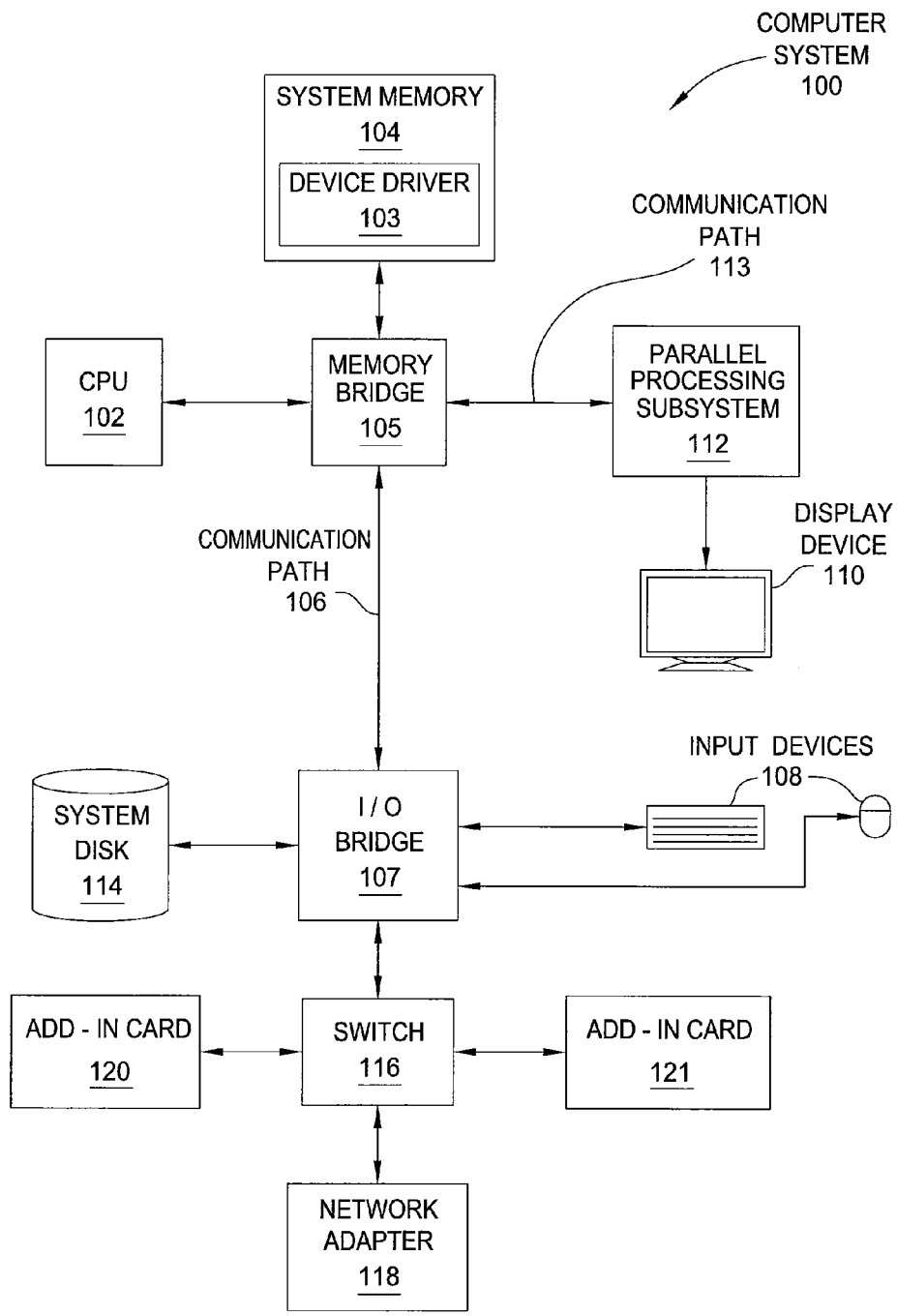
FIG. 1 is a block diagram illustrating a computer system configured to implement one or more aspects of the present invention.

FIG. 1 is a block diagram illustrating a computer system 100 configured to implement one or more aspects of the present invention. Computer system 100 includes a central processing unit (CPU) 102 and a system memory 104 communicating via an interconnection path that may include a memory bridge 105. Memory bridge 105, which may be, e.g., a Northbridge chip, is connected via a bus or other communication path 106 (e.g., a HyperTransport link) to an I/O (input/output) bridge 107. I/O bridge 107, which may be, e.g., a Southbridge chip, receives user input from one or more user input devices 108 (e.g., keyboard, mouse) and forwards the input to CPU 102 via path 106 and memory bridge 105. A parallel processing subsystem 112 is coupled to memory bridge 105 via a bus or other communication path 113 (e.g., a PCI Express, Accelerated Graphics Port, or HyperTransport link); in one embodiment parallel processing subsystem 112 is a graphics subsystem that delivers pixels to a display device 110 (e.g., a conventional CRT or LCD based monitor). A system disk 114 is also connected to I/O bridge 107. A switch 116 provides connections between I/O bridge 107 and other components such as a network adapter 118 and various add-in cards 120 and 121. Other components (not explicitly shown), including USB or other port connections, CD drives, DVD drives, film recording devices, and the like, may also be connected to I/O bridge 107. Communication paths interconnecting the various components in FIG. 1 may be implemented using any suitable protocols, such as PCI (Peripheral Component Interconnect), PCI-Express, AGP (Accelerated Graphics Port), HyperTransport, or any other bus or point-to-point communication protocol(s), and connections between different devices may use different protocols as is known in the art.

The system memory 104 includes an application program and device driver 103. The application program generates calls to a graphics API in order to produce a desired set of results, typically in the form of a sequence of graphics images. The application program also transmits one or more high-level shading programs to the graphics API for processing within the device driver 103. The high-level shading programs are typically source code text of high-level programming instructions that are designed to operate on one or more shaders within the parallel processing subsystem 112. The graphics API functionality is typically implemented within the device driver 103.

In one embodiment, the parallel processing subsystem 112 incorporates circuitry optimized for graphics and video processing, including, for example, video output circuitry, and constitutes a graphics processing unit (GPU). In another embodiment, the parallel processing subsystem 112 incorporates circuitry optimized for general purpose processing, while preserving the underlying computational architecture, described in greater detail herein. In yet another embodiment, the parallel processing subsystem 112 may be integrated with one or more other system elements, such as the memory bridge 105, CPU 102, and I/O bridge 107 to form a system on chip (SoC).

It will be appreciated that the system shown herein is illustrative and that variations and modifications are possible. The connection topology, including the number and arrangement of bridges, the number of CPUs 102, and the number of parallel processing subsystems 112, may be modified as desired. For instance, in some embodiments, system memory 104 is connected to CPU 102 directly rather than through a bridge, and other devices communicate with system memory 104 via memory bridge 105 and CPU 102. In other alternative topologies, parallel processing subsystem 112 is connected to I/O bridge 107 or directly to CPU 102, rather than to memory bridge 105. In still other embodiments, I/O bridge 107 and memory bridge 105 might be integrated into a single chip. Large embodiments may include two or more CPUs 102 and two or more parallel processing systems 112. The particular components shown herein are optional; for instance, any number of add-in cards or peripheral devices might be supported. In some embodiments, switch 116 is eliminated, and network adapter 118 and add-in cards 120, 121 connect directly to I/O bridge 107.

Figure 2:
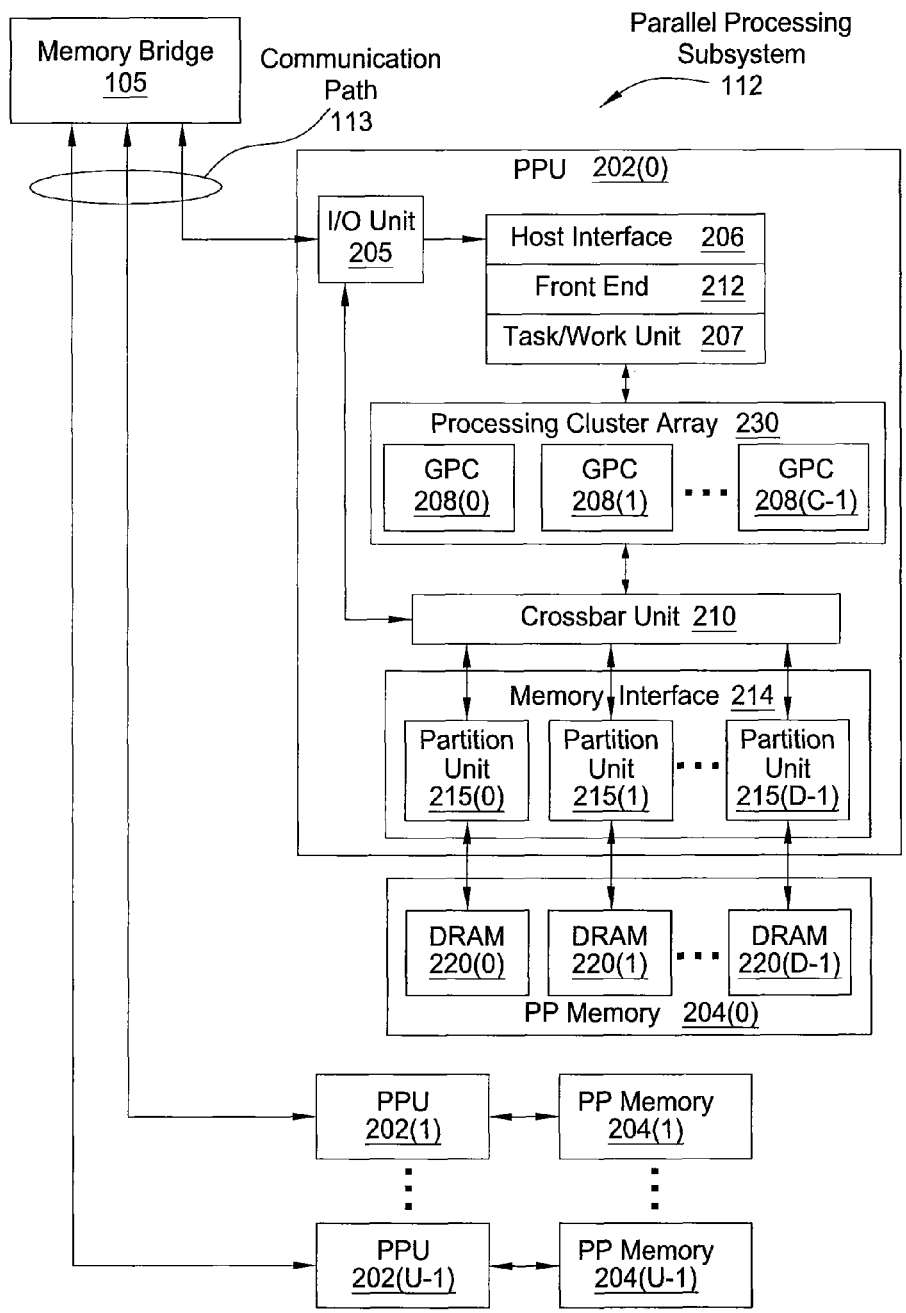
FIG. 2 illustrates a parallel processing subsystem, according to one embodiment of the present invention.

FIG. 2 illustrates a parallel processing subsystem 112, according to one embodiment of the present invention. As shown, parallel processing subsystem 112 includes one or more parallel processing units (PPUs) 202, each of which is coupled to a local parallel processing (PP) memory 204. In general, a parallel processing subsystem includes a number U of PPUs, where U≥1. (Herein, multiple instances of like objects are denoted with reference numbers identifying the object and parenthetical numbers identifying the instance where needed.) PPUs 202 and parallel processing memories 204 may be implemented using one or more integrated circuit devices, such as programmable processors, application specific integrated circuits (ASICs), or memory devices, or in any other technically feasible fashion.

Referring again to FIG. 1, in some embodiments, some or all of PPUs 202 in parallel processing subsystem 112 are graphics processors with rendering pipelines that can be configured to perform various tasks related to generating pixel data from graphics data supplied by CPU 102 and/or system memory 104 via memory bridge 105 and bus 113, interacting with local parallel processing memory 204 (which can be used as graphics memory including, e.g., a conventional frame buffer) to store and update pixel data, delivering pixel data to display device 110, and the like. In some embodiments, parallel processing subsystem 112 may include one or more PPUs 202 that operate as graphics processors and one or more other PPUs 202 that are used for general-purpose computations. The PPUs may be identical or different, and each PPU may have its own dedicated parallel processing memory device(s) or no dedicated parallel processing memory device(s). One or more PPUs 202 may output data to display device 110 or each PPU 202 may output data to one or more display devices 110.

In operation, CPU 102 is the master processor of computer system 100, controlling and coordinating operations of other system components. In particular, CPU 102 issues commands that control the operation of PPUs 202. In some embodiments, CPU 102 writes a stream of commands for each PPU 202 to a push buffer (not explicitly shown in either FIG. 1 or FIG. 2) that may be located in system memory 104, parallel processing memory 204, or another storage location accessible to both CPU 102 and PPU 202. PPU 202 reads the command stream from the push buffer and then executes commands asynchronously relative to the operation of CPU 102.

Referring back now to FIG. 2, each PPU 202 includes an I/O (input/output) unit 205 that communicates with the rest of computer system 100 via communication path 113, which connects to memory bridge 105 (or, in one alternative embodiment, directly to CPU 102). The connection of PPU 202 to the rest of computer system 100 may also be varied. In some embodiments, parallel processing subsystem 112 is implemented as an add-in card that can be inserted into an expansion slot of computer system 100. In other embodiments, a PPU 202 can be integrated on a single chip with a bus bridge, such as memory bridge 105 or I/O bridge 107. In still other embodiments, some or all elements of PPU 202 may be integrated on a single chip with CPU 102.

In one embodiment, communication path 113 is a PCI-EXPRESS link, in which dedicated lanes are allocated to each PPU 202, as is known in the art. Other communication paths may also be used. An I/O unit 205 generates packets (or other signals) for transmission on communication path 113 and also receives all incoming packets (or other signals) from communication path 113, directing the incoming packets to appropriate components of PPU 202. For example, commands related to processing tasks may be directed to a host interface 206, while commands related to memory operations (e.g., reading from or writing to parallel processing memory 204) may be directed to a memory crossbar unit 210. Host interface 206 reads each push buffer and outputs the work specified by the push buffer to a front end 212.

Each PPU 202 advantageously implements a highly parallel processing architecture. As shown in detail, PPU 202(0) includes a processing cluster array 230 that includes a number C of general processing clusters (GPCs) 208, where C≥1. Each GPC 208 is capable of executing a large number (e.g., hundreds or thousands) of threads concurrently, where each thread is an instance of a program. In various applications, different GPCs 208 may be allocated for processing different types of programs or for performing different types of computations. For example, in a graphics application, a first set of GPCs 208 may be allocated to perform tessellation operations and to produce primitive topologies for patches, and a second set of GPCs 208 may be allocated to perform tessellation shading to evaluate patch parameters for the primitive topologies and to determine vertex positions and other per-vertex attributes. The allocation of GPCs 208 may vary dependent on the workload arising for each type of program or computation.

GPCs 208 receive processing tasks to be executed via a work distribution unit 207, which receives commands defining processing tasks from front end unit 212. Processing tasks include indices of data to be processed, e.g., surface (patch) data, primitive data, vertex data, and/or pixel data, as well as state parameters and commands defining how the data is to be processed (e.g., what program is to be executed). Work distribution unit 207 may be configured to fetch the indices corresponding to the tasks, or work distribution unit 207 may receive the indices from front end 212. Front end 212 ensures that GPCs 208 are configured to a valid state before the processing specified by the push buffers is initiated.

When PPU 202 is used for graphics processing, for example, the processing workload for each patch is divided into approximately equal sized tasks to enable distribution of the tessellation processing to multiple GPCs 208. A work distribution unit 207 may be configured to produce tasks at a frequency capable of providing tasks to multiple GPCs 208 for processing. By contrast, in conventional systems, processing is typically performed by a single processing engine, while the other processing engines remain idle, waiting for the single processing engine to complete its tasks before beginning their processing tasks. In some embodiments of the present invention, portions of GPCs 208 are configured to perform different types of processing. For example a first portion may be configured to perform vertex shading and topology generation, a second portion may be configured to perform tessellation and geometry shading, and a third portion may be configured to perform pixel shading in screen space to produce a rendered image. Intermediate data produced by GPCs 208 may be stored in buffers to allow the intermediate data to be transmitted between GPCs 208 for further processing.

Memory interface 214 includes a number D of partition units 215 that are each directly coupled to a portion of parallel processing memory 204, where D≥1. As shown, the number of partition units 215 generally equals the number of DRAM 220. In other embodiments, the number of partition units 215 may not equal the number of memory devices. Persons skilled in the art will appreciate that DRAM 220 may be replaced with other suitable storage devices and can be of generally conventional design. A detailed description is therefore omitted. Render targets, such as frame buffers or texture maps may be stored across DRAMs 220, allowing partition units 215 to write portions of each render target in parallel to efficiently use the available bandwidth of parallel processing memory 204.

Any one of GPCs 208 may process data to be written to any of the DRAMs 220 within parallel processing memory 204. Crossbar unit 210 is configured to route the output of each GPC 208 to the input of any partition unit 215 or to another GPC 208 for further processing. GPCs 208 communicate with memory interface 214 through crossbar unit 210 to read from or write to various external memory devices. In one embodiment, crossbar unit 210 has a connection to memory interface 214 to communicate with I/O unit 205, as well as a connection to local parallel processing memory 204, thereby enabling the processing cores within the different GPCs 208 to communicate with system memory 104 or other memory that is not local to PPU 202. In the embodiment shown in FIG. 2, crossbar unit 210 is directly connected with I/O unit 205. Crossbar unit 210 may use virtual channels to separate traffic streams between the GPCs 208 and partition units 215.

Again, GPCs 208 can be programmed to execute processing tasks relating to a wide variety of applications, including but not limited to, linear and nonlinear data transforms, filtering of video and/or audio data, modeling operations (e.g., applying laws of physics to determine position, velocity and other attributes of objects), image rendering operations (e.g., tessellation shader, vertex shader, geometry shader, and/or pixel shader programs), and so on. PPUs 202 may transfer data from system memory 104 and/or local parallel processing memories 204 into internal (on-chip) memory, process the data, and write result data back to system memory 104 and/or local parallel processing memories 204, where such data can be accessed by other system components, including CPU 102 or another parallel processing subsystem 112.

A PPU 202 may be provided with any amount of local parallel processing memory 204, including no local memory, and may use local memory and system memory in any combination. For instance, a PPU 202 can be a graphics processor in a unified memory architecture (UMA) embodiment. In such embodiments, little or no dedicated graphics (parallel processing) memory would be provided, and PPU 202 would use system memory exclusively or almost exclusively. In UMA embodiments, a PPU 202 may be integrated into a bridge chip or processor chip or provided as a discrete chip with a high-speed link (e.g., PCI-EXPRESS) connecting the PPU 202 to system memory via a bridge chip or other communication means.

As noted above, any number of PPUs 202 can be included in a parallel processing subsystem 112. For instance, multiple PPUs 202 can be provided on a single add-in card, or multiple add-in cards can be connected to communication path 113, or one or more of PPUs 202 can be integrated into a bridge chip. PPUs 202 in a multi-PPU system may be identical to or different from one another. For instance, different PPUs 202 might have different numbers of processing cores, different amounts of local parallel processing memory, and so on. Where multiple PPUs 202 are present, those PPUs may be operated in parallel to process data at a higher throughput than is possible with a single PPU 202. Systems incorporating one or more PPUs 202 may be implemented in a variety of configurations and form factors, including desktop, laptop, or handheld personal computers, servers, workstations, game consoles, embedded systems, and the like.

Figure 3:
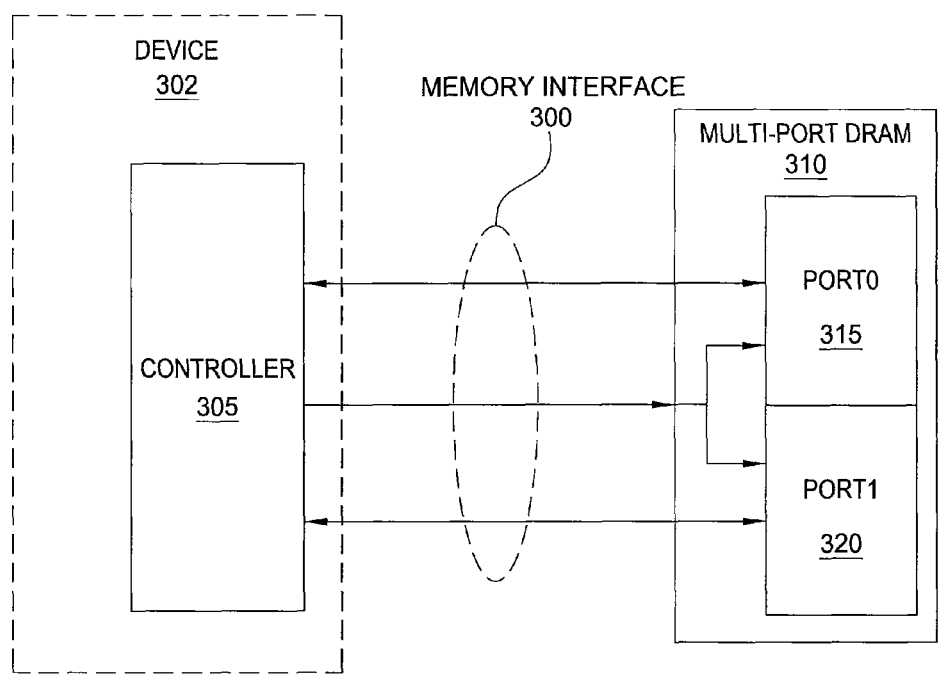
FIG. 3 is a conceptual block diagram of a memory subsystem including a memory controller and two DRAM devices, according to one embodiment of the present invention.

FIG. 3 is a conceptual block diagram of memory interface 300 between and memory controller 305 and a multi-port dynamic random access memory (DRAM) device 310, according to one embodiment of the present invention. The memory controller 305 is typically included within a device 302 that is packaged having pins or solder bumps to for each data or control input and/or output, e.g., a processor or a memory bridge device. The multi-port DRAM 310 differs from a conventional DRAM, such as a DDR DRAM because the memory storage within the multi-port DRAM 310 is separated into two independent halves, a port0 315 and a port 320. Although the multi-port DRAM 310 is shown in FIG. 3 as having only two data ports, in other embodiments, the memory storage may be divided into more than two portions, where each portion is associated with a dedicated data port. A similar multi-port architecture can be used by memory buffer devices that translate a command and address connection (CMD/ADDR) from a memory controller to a multi-port memory. The memory interface 100 includes a bi-directional data interface between the memory controller and the multi-port DRAM 110, where each data interface is associated with a respective data port that accesses a corresponding portion of the memory storage. The memory interface 300 also includes a single communication interface that is configured to support a time-multiplexed communication protocol for transmitting command and address information from the memory controller 305 to the multi-port DRAM 310. Within the multi-port DRAM 310 the time-multiplexed command and address information is demultiplexed into commands and addresses that are transmitted to the port0 315 and commands and addresses that are transmitted to the port1 320.

A typical access protocol for a DRAM device requires 4 clock cycles between two row activate commands and at least 1 idle clock cycle between two column read/write commands for a GDDR5 and DDR2 interface (or 3 idle clock cycles for a DDR3 interface). For example, where the minimum burst length is two clocks as in DDR2, data is transmitted for two consecutive clock cycles for each burst read or write. For a DRAM with Read or Write Latency of two clock cycle, a burst read or write command is transmitted during a first clock cycle resulting in the transmission of data on the data bus during the third and fourth clock cycles, respectively. Because the minimum burst length is 2, no data access command is transmitted during the second clock cycle. An activate command (ACT) maybe transmitted to activate a different row of the memory storage corresponding to the either port of the dual-port DRAM device. For a multi-bank memory device, a memory controller is not required to issue a NOP (no operation) command during an idle clock cycle, but may instead use a slot to send Activate or Precharge command to other rows or banks in the memory device. Due to the constraints imposed by the burst accesses, data access, read or write commands, and address information can only be transmitted during half or quarter of the available clock cycles depending on the minimum burst length.

The memory controller 305 receives memory access requests to read data from and write data to the multi-port DRAM 310. The memory controller 305 is configured to sort access requests based on an address that is provided with each access request. The address may be a virtual address that is translated by the memory controller 305 into a physical address of the multi-port DRAM 310. Each port of the multi-port DRAM 310 is associated with a different set of addresses.

The memory controller 305 fills each clock cycle (or time slot) with command and address information for the appropriate port to generate the stream of command and address information that is transmitted. In addition to read and write access requests, the command and address information also encodes operations such as precharge, activate, and NOP commands.

The multi-port DRAM device 310 receives the stream of commands and addresses from the memory controller 105. The multi-port DRAM device 310 includes memory storage divided into two or more portions, e.g., port0 memory storage and port1 memory storage. In one embodiment, the first data port and the second data port are each 32-bits wide and the minimum burst length is 4, 8, or 16 clock cycles so that the minimum burst size is 16 bytes, 32 bytes, or 64 bytes, respectively.

Address Bit Remapping Scheme to Reduce Access Granularity of DRAM Accesses

Figure 4A:
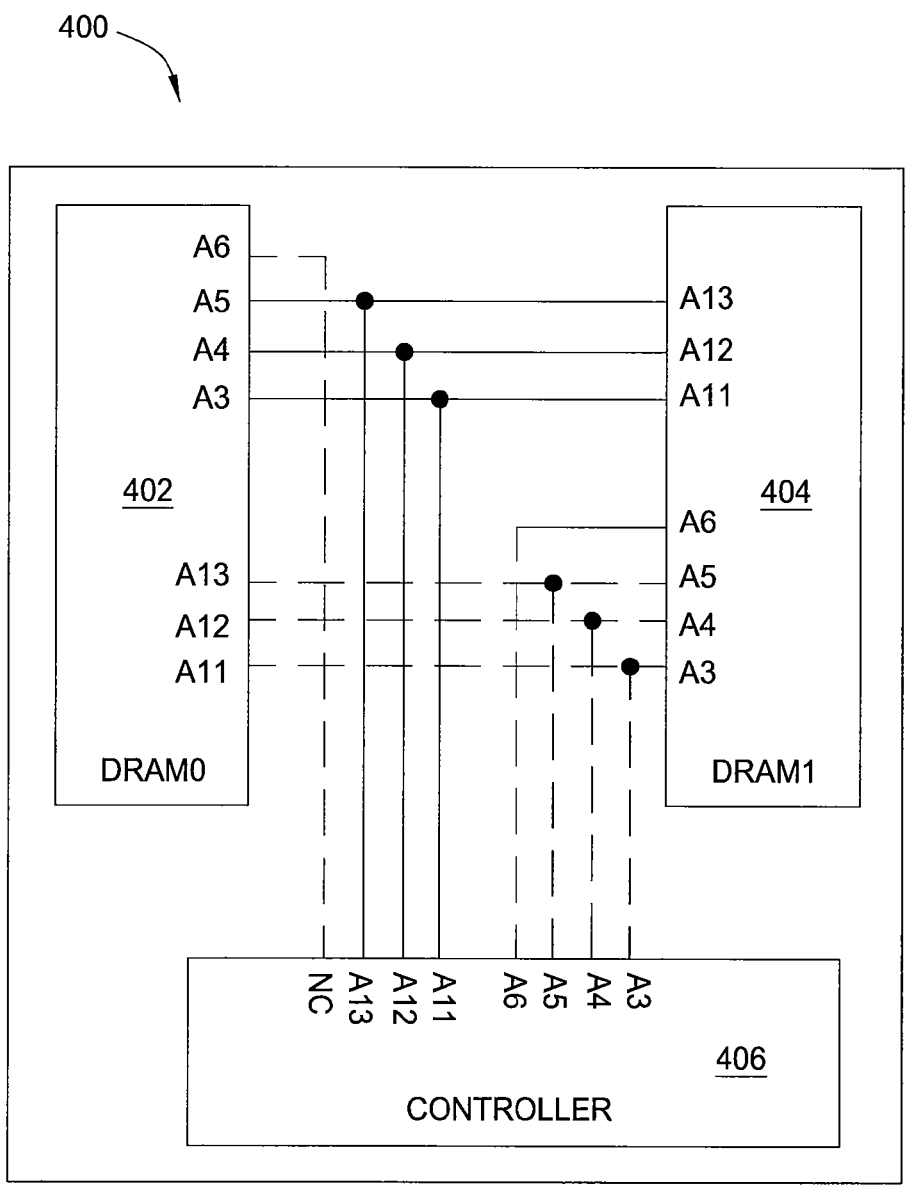
FIG. 4A is a conceptual block diagram of a memory subsystem with efficient bit remapping, according to one embodiment of the present invention.

FIG. 4A is a conceptual block diagram of a memory subsystem 400 including a memory controller 406, and two DRAM devices (DRAM0 402, DRAM1 404), according to one embodiment of the present invention. The memory controller 406 is typically included within a device that is packaged having pins for each data or control input and/or output, e.g., a processor or a memory bridge device, such as PPU 202 from FIG. 2 or memory bridge 105 from FIGS. 1 and 2. Memory controller 406 may be configured in substantially the same manner as the memory controller 305 of FIG. 3 to read from and write data to the DRAM devices, DRAM0 402 and DRAM1 404. DRAM0 402 and DRAM1 404 may be configured in substantially the same manner as the multi-port DRAM device 310 of FIG. 3 to receive commands and addresses from memory controller 406, where DRAM0 402 and DRAM1 404 are each 32-bits wide with a minimum burst size of 32 bytes.

DRAM0 402 and DRAM1 404 each have multiple memory banks that are configured to store multiple memory pages worth of data. In the implementation reflected in FIG. 4A, a given memory page may be stored across DRAM0 402 and DRAM1 404 such that the memory page spans across corresponding rows within DRAM0 402 and DRAM1 404. In some embodiments, a memory bank within DRAM0 402 or DRAM1 404 may store either 4K, 8K, or 16K rows of data. In some embodiments, a single row may include either 2 Kbytes, 4 Kbytes, or 8 Kbytes of memory for storing data. As is well-understood, the number of pins required to access a memory page to read or write data depends on the number and length of rows in the memory bank, the burst length, and the flexibility desired.

As shown, each of the memory controller 406 and the DRAM0 402 and DRAM1 404 has a plurality of pins. Although not shown, memory controller 406 has pins A0-A13 and one unused pin, and each of DRAM0 402 and DRAM1 404 has pins A0-A13. Each of pins A0-A13 on memory controller 406 is connected to a different one of pins A0-A13 on both DRAM0 402 and DRAM1 404.

As configured, the memory controller 406 may send row address commands to pins A13-A0 (i.e., 14 bits) to activate simultaneously the same logical memory page within both DRAM0 402 and DRAM1 404. For the column address command, the upper or most significant pins of memory controller 406 and the address DRAM0 402 pins may be swizzled, or repurposed. "Swizzling," as used herein, refers to routing of lines on a printed circuit board (PCB), in this case DRAM0 402 and memory controller 406, where bit ordering for address commands is different on the memory controller side as compared to the DRAM side. For example, column commands are commonly transmitted across the lower or least significant pins of a memory controller and a DRAM device while the row commands may use all the pins of the memory controller 406. However, in order to transmit column address commands to both DRAM0 402 and DRAM1 404 so that the same logical memory page can be accessed across both devices, the upper or most significant pins of memory controller 406 are configured to transmit address commands to the lower or least significant pins of one of the DRAM devices, here DRAM0 402. Thus, as command and address travel to/from memory controller 406 to/from memory device 402, the command and address is swizzled by the lines connecting the upper pins of memory controller 406 and the lower pins of DRAM0 402.

In some embodiments, any number of pins may be swizzled, meaning that the number of upper or most significant pins of memory controller 406 and the number of lower or least significant pins of the DRAM device, here DRAM0 402, that are reconfigured to enable address commands to be transmitted across those pins may vary based on the length of the page, the number of pins available, and the addressing flexibility desired. Furthermore, in some embodiments, pins other than the upper or most significant pins on memory controller 406 and pins other than the lower or least significant pins of the DRAM device may be swizzled.

Looking specifically now to the embodiment in FIG. 4, during a column access, seven lower or least significant pins A3-A9 on the memory controller 406 are used to transmit a first column address command to DRAM1 404 via the lower or least significant pins A3-A9 on DRAM1 404. In addition, seven upper or most significant pins A13, A12, A11, as well A10, A14 (not shown), A15 (shown as NC) and one additional pin A16 (not shown) on the memory controller 406 are repurposed to transmit a second column address command to DRAM0 402 via lower or least significant pins A3-A9 on DRAM0 402. In so configuring the pins of memory controller 406, the upper pins of the memory controller 406, A10-A16, and lower pins, A3-A9 of DRAM0 402 are swizzled, e.g., A13 is connected to A3, A12 is connected to A4, and A11 is connected to A5, etc. Using the swizzled configuration, the memory controller 406 can send a column command to DRAM1 404 via the lower or least significant pins of memory controller 406, and with the repurposed upper or most significant pins of memory controller 406, the memory controller 406 can send another column command to DRAM0 402. Thus, the memory controller 406 is able to access two non-contiguous locations within the same logical memory page—a first location in DRAM0 402 and a second location in DRAM1 404.

The distance between page access locations within a memory page depends on the number of pins used, e.g., in the embodiment shown in FIG. 4A, nine pins are used for column access (i.e., pins A3-A11 and NC) the page addresses may be 512 bytes apart. The addresses may be extended to 2048 bytes apart for DRAMs having eleven pins for column address commands (i.e., additional row pins A14 and A15) or multi-modal controllers that have additional unused pins for rank select.

Figure 4B:
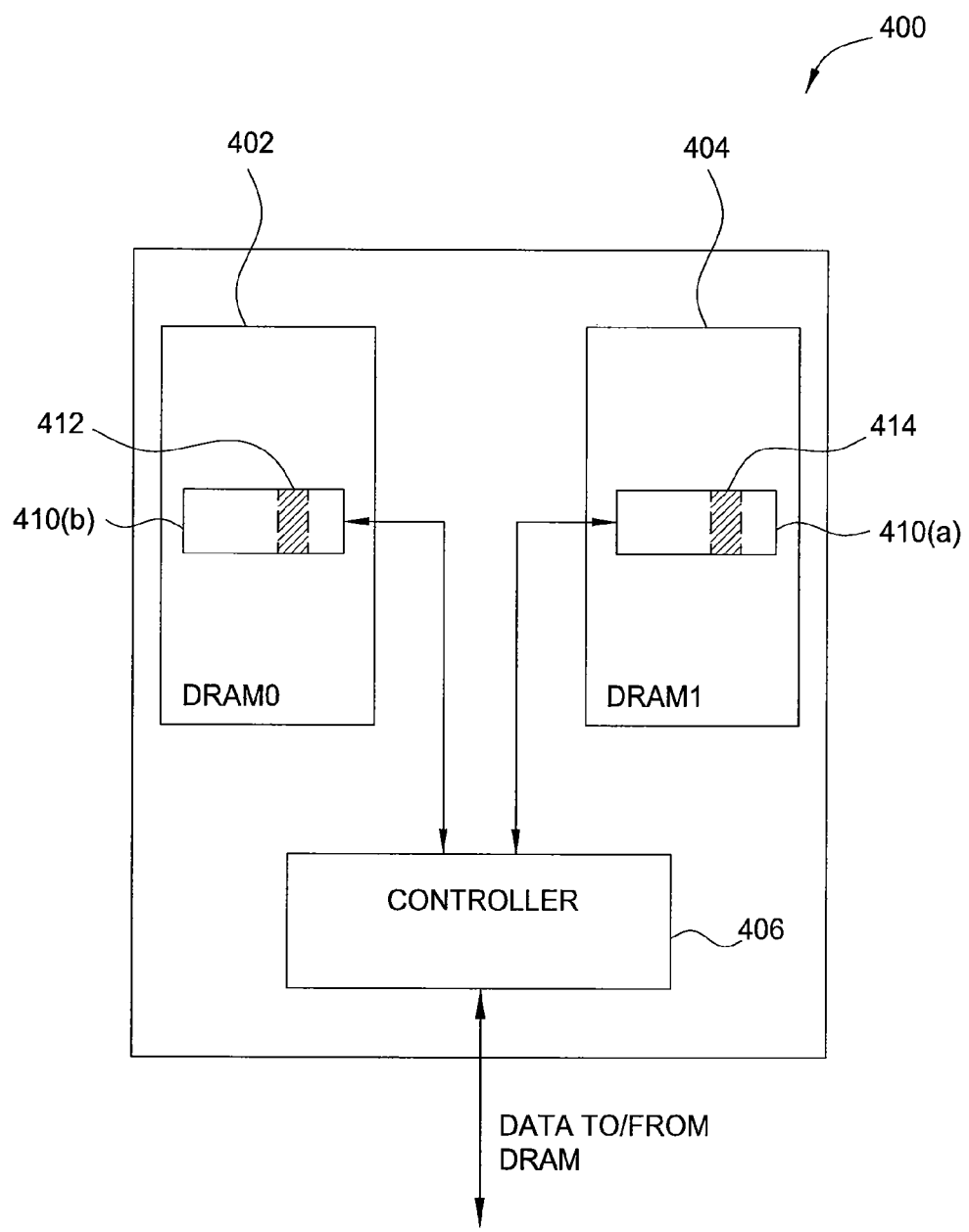
FIG. 4B is a conceptual block diagram of a memory subsystem with memory access at non-contiguous locations within a DRAM memory page, according to one embodiment of the present invention.

FIG. 4B is a conceptual block diagram of the memory subsystem 400 with memory access at non-contiguous locations within a DRAM memory page, according to one embodiment of the present invention. As shown, the memory subsystem includes DRAM0 402, DRAM1 404 and memory controller 406. DRAM0 402 and DRAM1 404 include logical memory page 410. DRAM0 402 includes page location 412 and DRAM1 404 includes page location 414. As previously described herein, memory controller 406 is configured to activate/open a page of memory that spans at least part of both DRAM0 402 and DRAM1 404, such as DRAM memory page 410. Using repurposed pins and the swizzling technique described above in conjunction with FIG. 4A, memory controller 406 can transmit column addresses to both DRAM0 402 and DRAM1 404 in order to access page 410 at location 412 on DRAM0 402 and location 414 on DRAM1 404. The memory controller 406 may send data commands to read from or write data to the memory devices DRAM0 402 and DRAM1 404 from locations 412 and 414, respectively, within page 410. As shown and described above, locations 412 and 414 are non-contiguous memory page locations.

Figure 5:
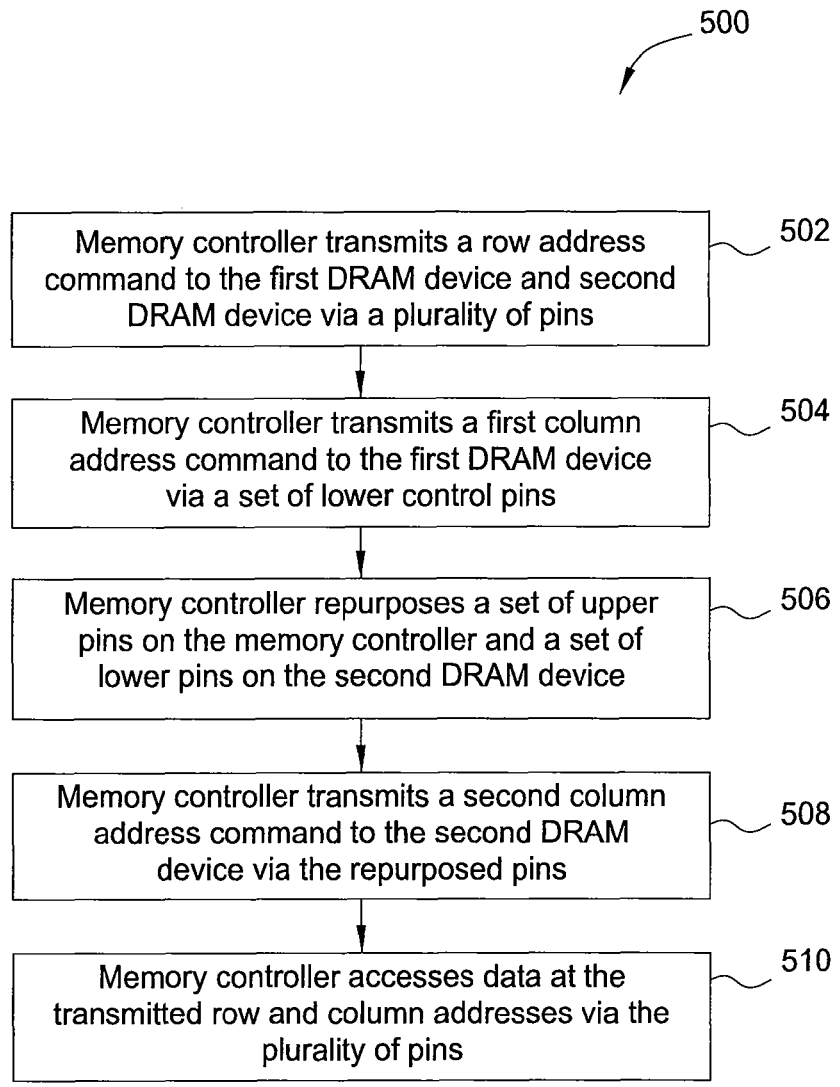
FIG. 5 is a flow diagram of method steps for accessing non-contiguous locations within a DRAM memory page, according to one embodiment of the present invention

FIG. 5 sets forth a flow diagram of method steps for accessing non-contiguous locations within a DRAM memory page, according to one embodiment of the present invention. Although the method steps are described in conjunction with the system for FIGS. 1-4, persons skilled in the art will understand that any system configured to perform the method steps, in any order, is within the scope of the invention.

As shown, a method 500 begins at step 502, where memory controller 406 opens a DRAM memory page 410 by transmitting a row address command to DRAM1 device 404 and DRAM0 402 via a plurality of pins on the memory controller 406 and corresponding pins on DRAM1 404 and DRAM0 402. At step 504, memory controller 406 transmits a first column address command to DRAM1 404 via a set of lower pins on the memory controller 406 and a corresponding set of lower pins on DRAM1 404.

At step 506, memory controller 406 swizzles the upper or most significant pins on the memory controller 406 with the lower pins on DRAM0 402 to repurpose the upper or most significant pins on memory controller 406 for transmitting address commands to DRAM0 402.

At step 508, memory controller 406 transmits a swizzled second column address command to DRAM0 402 via the repurposed upper or most significant pins on the memory controller 406 and a set of lower or least significant pins on DRAM0 402. And at step 510, memory controller 406 accesses data at the transmitted row and column addresses via a plurality of pins on the memory controller 406 and a corresponding plurality of pins on DRAM1 404 and a corresponding plurality of pins on DRAM0 402.

In sum, as set forth herein, a memory subsystem is implemented for accessing non-contiguous address locations within a DRAM page. In one embodiment, the memory subsystem has a memory controller and at least two DRAM devices. The memory controller comprises a plurality of pins. Each of the at least two DRAM devices also comprises a plurality of pins. A set of upper pins on the memory controller are swizzled with a set of lower pins on a second DRAM device and a set of lower pins on the memory controller are directly coupled to a corresponding set of lower pins on the first DRAM device. The memory controller transmits row address commands to the first DRAM device and the second DRAM device via the upper pins and the lower pins. The memory controller transmits column address commands to the first DRAM device via the set of lower pins on the memory controller and the set of lower pins on the first DRAM device. The memory controller transmits a second column address command to the second DRAM device via the swizzled set of upper pins on the memory controller and set of lower control pins on the second DRAM device. The memory controller accesses data at the memory addresses via the plurality of pins.

One advantage of the disclosed technique is that non-contiguous page locations can be accessed for reduced granularity of DRAM accesses with few or no additional pins, minimal additional space requirements, and minimal additional power consumption compared to conventional approach. Access to non-contiguous page locations allows for data access with increased granularity and therefore more efficient use of available pins.

The techniques above have been described above with reference to specific embodiments. Persons skilled in the art, however, will understand that various modifications and changes may be made thereto without departing from the broader spirit and scope of the technique as set forth in the appended claims. The foregoing description and drawings are, accordingly, to be regarded in an illustrative rather than a restrictive sense.

We claim:

1. A method for accessing non-contiguous locations within a dynamic random access memory (DRAM) memory page, the method comprising:

transmitting a row address command to a first DRAM device and to a second DRAM device via a plurality of pins on a memory controller connected with a corresponding plurality of pins on the first DRAM device and a corresponding plurality of pins on the second DRAM device;

transmitting a first column address command to the first DRAM device via a set of lower pins on the memory controller and a set of lower pins on the first DRAM device;

swizzling a set of upper pins on the memory controller with a set of lower pins on the second DRAM device;

after swizzling the set of upper pins, transmitting a second column address command to the second DRAM device via the set of upper pins on the memory controller and the set of lower pins on the second DRAM device; and transmitting a data command to the first DRAM device and the second DRAM device via the plurality of pins on the memory controller to access a first memory page that is stored in part in the first DRAM device and stored in part in the second DRAM device.

2. The method of claim 1, wherein the set of upper pins on the memory controller are repurposed for transmitting the second column address command to the set of lower pins on the second DRAM device.

3. The method of claim 1, wherein the first column address and the second column address comprise non-contiguous addresses within the first memory page.

4. The method of claim 3, wherein at least a portion of the first memory page is stored within a row of the first DRAM device and at least a portion of the first memory page is stored within a corresponding row of the second DRAM device.

5. The method of claim 3, wherein the distance between the first column address and the second column address is dependent on the number of pins in the plurality of pins on the memory controller.

6. A memory subsystem for accessing non-contiguous locations within a memory page, the memory subsystem comprising:

a first DRAM device having a plurality of pins;

a second DRAM device having a plurality of pins; and a memory controller having a plurality of pins and configured to:

transmit a row address command to the first DRAM device and to the second DRAM device via the plurality of pins on the memory controller connected with a corresponding plurality of pins on the first DRAM device and a corresponding plurality of pins on the second DRAM device;

transmit a first column address command to the first DRAM device via a set of lower pins on the memory controller and a set of lower pins on the first DRAM device;

swizzle a set of upper pins on the memory controller with a set of lower pins on the second DRAM device;

after swizzling the set of upper pins, transmit a second column address command to the second DRAM device via the set of upper pins on the memory controller and the set of lower pins on the second DRAM device; and transmit a data command to the first DRAM device and the second DRAM device via the plurality of pins on the memory controller to access a first memory page that is stored in part in the first DRAM device and stored in part in the second DRAM device.

7. The memory subsystem of claim 6, wherein the set of upper pins on the memory controller are repurposed for transmitting the second column address command to the set of lower pins on the second DRAM device.

8. The memory subsystem of claim 6, wherein the first column address and the second column address comprise non-contiguous addresses within the first memory page.

9. The memory subsystem of claim 8, wherein at least a portion of the first memory page is stored within a row of the first DRAM device and at least a portion of the first memory page is stored within a corresponding row of the second DRAM device.

10. The memory subsystem of claim 8, wherein the distance between the first column address and the second column address is dependent on the number of pins in the plurality of pins on the memory controller.

11. A computing device, comprising
a memory subsystem for accessing non-contiguous locations within a memory page, the memory subsystem comprising:
   a first DRAM device having a plurality of pins;
   a second DRAM device having a plurality of pins; and
   a memory controller having a plurality of pins and configured to:
      transmit a row address command to the first DRAM device and to the second DRAM device via the plurality of pins on a memory controller and the corresponding plurality of pins on the first DRAM device and the corresponding plurality of pins on the second DRAM device;
      transmit a first column address command to the first DRAM device via a set of lower pins on the memory controller and a set of lower pins on the first DRAM device;
      swizzle a set of upper pins on the memory controller with a set of lower pins on the second DRAM device;
      after swizzling the set of upper pins, transmit a second column address command to the second DRAM device via the set of upper pins on the memory controller and the set of lower pins on the second DRAM device; and
      transmit a data command to the first DRAM device and the second DRAM device via the plurality of pins on the memory controller to access a first memory page that is stored in part in the first DRAM device and stored in part in the second DRAM device.

12. The computing device of claim 11, wherein the set of upper pins on the memory controller are repurposed for transmitting the second column address command to the set of lower pins on the second DRAM device.

13. The method of claim 1, wherein the set of lower pins and the set of upper pins in the plurality of pins on the memory controller comprise no overlapping pins.

14. The method of claim 1, wherein accessing the first memory page comprises reading from or writing to the first memory page.

15. The method of claim 1, wherein:
   the first column address command accesses a first location of the first memory page on the first DRAM device;
   the second column address command accesses a second location of the first memory page on the second DRAM device, the first and second locations comprising non-contiguous locations within the first memory page; and
   the first and second locations are accessed simultaneously.

16. The method of claim 1, wherein the first memory page comprises non-contiguous locations stored across the first DRAM device at the first column address and the second DRAM device at the second column address.

17. The method of claim 1, wherein the first memory page comprises non-contiguous locations stored at the same row address on the first and second DRAM devices and at different column addresses at the first and second DRAM devices.

18. The method of claim 1, wherein the steps of transmitting the row address command, transmitting the first column address command, and transmitting the second column address command are performed for accessing a same logical memory page comprising non-contiguous locations residing at the same row address on the first and second DRAM devices and at different column addresses on the first and second DRAM devices.

* * * * *